United States Patent
Toutounchi et al.

(10) Patent No.: US 7,219,287 B1
(45) Date of Patent: May 15, 2007

(54) AUTOMATED FAULT DIAGNOSIS IN A PROGRAMMABLE DEVICE

(75) Inventors: Shahin Toutounchi, Pleasanton, CA (US); Andrew M. Taylor, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 315 days.

(21) Appl. No.: 10/955,560

(22) Filed: Sep. 29, 2004

(51) Int. Cl.
*G01R 31/28* (2006.01)
*G06F 11/00* (2006.01)
*G06F 19/00* (2006.01)
*G06F 15/00* (2006.01)

(52) U.S. Cl. .................. 714/738; 714/741; 714/725; 714/25; 714/2; 702/117; 707/202

(58) Field of Classification Search ............... None
See application file for complete search history.

(56) References Cited

U.S. PATENT DOCUMENTS

| | | | |
|---|---|---|---|
| 5,790,565 A | 8/1998 | Sakaguchi | |
| 6,003,150 A * | 12/1999 | Stroud et al. | 714/725 |
| 6,108,806 A * | 8/2000 | Abramovici et al. | 714/725 |
| 6,256,758 B1 * | 7/2001 | Abramovici et al. | 714/724 |
| 6,397,362 B1 | 5/2002 | Ishiyama | |
| 6,532,440 B1 | 3/2003 | Boppana et al. | |
| 6,560,736 B2 | 5/2003 | Ferguson et al. | |
| 6,594,610 B1 * | 7/2003 | Wells et al. | 702/117 |
| 6,631,487 B1 | 10/2003 | Abramovici et al. | |
| 6,721,914 B2 * | 4/2004 | Bartenstein et al. | 714/734 |
| 6,732,348 B1 | 5/2004 | Tahoori et al. | |
| 6,889,368 B1 * | 5/2005 | Mark et al. | 716/4 |

OTHER PUBLICATIONS

U.S. Appl. No. 10/280,611, filed Oct. 25, 2002, Mark et al.

* cited by examiner

*Primary Examiner*—Phung My Chung
(74) *Attorney, Agent, or Firm*—William L. Paradice, II; LeRoy D. Maunu

(57) ABSTRACT

A method and apparatus are disclosed that simplify and reduce the time required for detecting faults in a programmable device such as a programmable logic device (PLD) by utilizing fault coverage information corresponding to a plurality of test patterns for the PLD to reduce the set of potential faults. For one embodiment, each test pattern is designated as either passing or failing, the faults that are detectable by at least two failing test patterns and the faults that are not detectable by any passing test patterns are eliminated, and the remaining faults are diagnosed. For another embodiment, the faults detectable by each failing test pattern are diagnosed to generate corresponding fault sets, and the faults not common to the fault sets and not detectable by one or more of the failing test patterns are eliminated.

30 Claims, 9 Drawing Sheets

AUTOMATED FAULT DIAGNOSIS IN A PROGRAMMABLE DEVICE

FIELD OF INVENTION

The present invention relates generally to testing semiconductor circuits, and specifically to fault testing and diagnosis in a programmable device.

DESCRIPTION OF RELATED ART

Integrated circuit (IC) devices are typically tested for defects using a suitable fault model that describes the behavior of faults within the IC device. Perhaps the most commonly used fault model is the single stuck-at fault model, which assumes that the device contains a circuit node that has lost its ability to change logic states. As known in the art, stuck-at-one faults are physical defects that cause a circuit node to undesirably remain in a logic high state, and stuck-at-low faults are physical defects that cause a circuit node to undesirably remain in a logic low state. During testing, a set of test vectors are applied to the IC device to generate test results that indicate whether the IC device has any faults, and a fault simulation operation is performed to determine the fault coverage for the test vectors.

After testing, the test results are diagnosed to determine the location of any detected faults. Fault diagnosis techniques generally fall within two categories: the fault dictionary approach and the cause and effect approach. For the fault dictionary approach, a set of test vectors and a set of faults are first selected. Then, simulated circuit responses to the test vectors in the presence of each fault are generated. These pre-computed circuit responses, which are sometimes referred to as fault signatures, are stored in a fault dictionary. Then, the test vectors are applied to a device-under-test (DUT) to generate a set of observed circuit responses, which are then compared with the fault signatures in the fault dictionary to determine the location of faults (if any) in the DUT. Because this approach removes the onus of fault simulation from the diagnosis process, the diagnosis process may be automated (e.g., performed entirely using computers and software), which in turn may reduce fault testing and diagnosis costs. However, because each of the modeled faults typically requires a corresponding fault signature to be stored in the fault dictionary, the size of the fault dictionary may be exceedingly large, especially for circuits that require a large number of test vectors to achieve an acceptable level of fault coverage. Further, because each fault signature stored in the fault dictionary is typically compared with a corresponding observed circuit response, diagnosis techniques using fault dictionaries typically require an exceedingly large number of computations that often renders such approaches to fault diagnosis infeasible for complex IC devices.

For the cause and effect approach to fault diagnosis, a well-known automatic test pattern generator (ATPG) is typically used to generate a set of test vectors that are designed to detect a selected number of faults in the DUT. The test vectors are applied to the DUT to generate a corresponding set of actual circuit responses, which are then compared with a number of expected fault-free circuit responses to create difference information that is subsequently analyzed to localize the faults in the DUT. This approach is attractive to many users because it does not use exceedingly large fault dictionaries and because it does not require time consuming computations that may be impractical to implement for many IC devices. For example, unlike the fault dictionary approach, the cause and effect diagnostic approach allows fault dropping during the simulation process, which can significantly reduce the fault set and, therefore, also significantly reduce the number of computations required for diagnosis. However, analyzing the difference information to localize faults in the DUT in a cause and effect diagnosis process requires an intelligent decision making process (e.g., deductive reasoning), which is difficult, if not impossible, to automate. Accordingly, cause and effect approaches to fault diagnosis typically require a team of test engineers to implement, which can be expensive and time consuming.

Although originally designed for locating faults in application specific integrated circuits (ASIC), fault testing and diagnostic techniques are now applied to programmable devices such as programmable logic devices (PLDs). A PLD is a general-purpose device that can be programmed by a user to implement a variety of selected functions. One type of PLD is the Field Programmable Gate Array (FPGA), which typically includes an array of configurable logic blocks (CLBs) surrounded by a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data.

As known in the art, an FPGA can be configured to implement a variety of user-specified designs. Because it is impossible to activate all resources in an FPGA with a single configuration, acceptable FPGA fault coverage typically requires the FPGA to be tested for faults using many different test patterns, which makes conventional approaches to testing and diagnosis difficult to implement for FPGA devices. For example, because many test patterns are required, with each test pattern having a corresponding set of test vectors designed to detect a selected fault set in the FPGA, cause and effect approaches to fault diagnosis in an FPGA require more complex decision making (e.g., in deciding which test vectors to apply in which order to localize faults) than for ASICs having similar numbers of gates, which in turn requires an even larger number of test engineers and time to implement. Similarly, because multiple test patterns are required to provide adequate fault coverage for an FPGA device, using a fault dictionary approach to diagnose faults in an FPGA typically requires an exceedingly large file size and an excessive number of computations that render its implementation impractical.

Thus, there is a need for a simpler and less time consuming approach to detecting faults in PLDs such as FPGA devices.

SUMMARY

A method and apparatus are disclosed that simplify and reduce the time required for detecting faults in a programmable device by utilizing fault coverage information corresponding to a plurality of test patterns for the programmable device to reduce the set of potential faults for diagnosis. For some embodiments, a number of test patterns are generated for the programmable device, and the programmable device is simulated using the test patterns to determine which faults each test pattern detects. The resulting fault coverage information may be stored in a fault database. Then, the programmable device is fault tested using each of the test patterns, and each test pattern is designated as either a passing test pattern or a failing test pattern. Information designating each test pattern as passing or failing may then be used to generate a reduced fault set upon which any suitable fault diagnosis technique may be performed to identify the remaining faults.

For one embodiment, the reduced fault set is generated by eliminating all faults that are not detected by at least two failing test patterns and eliminating all faults that are detected by one or more passing test patterns, after which the remaining faults may be diagnosed in a well-known manner to identify the faults. For another embodiment, a suitable fault diagnosis technique may be first performed on each of the failing test patterns to generate corresponding fault sets, and the reduced fault set may be generated by eliminating all faults that are not common to the fault sets and eliminating all faults that are not detectable by the failing test patterns.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are described below with respect to an exemplary FPGA architecture that is generally representative of the Virtex family of FPGA devices from Xilinx, Inc., for simplicity only. It is to be understood that embodiments of the present invention are equally applicable other FPGA architectures, and to other programmable devices, including programmable logic devices such as complex PLDs and integrated circuits that are at least partially programmable. In the following description, for purposes of explanation, specific nomenclature is set forth to provide a thorough understanding of the present invention. In other instances, well-known circuits and devices are shown in block diagram form to avoid obscuring the present invention. Further, the particular order in which embodiments of the present invention are performed may be altered. Accordingly, the present invention is not to be construed as limited to specific examples described herein but rather includes within its scope all embodiments defined by the appended claims.

Figure 1:
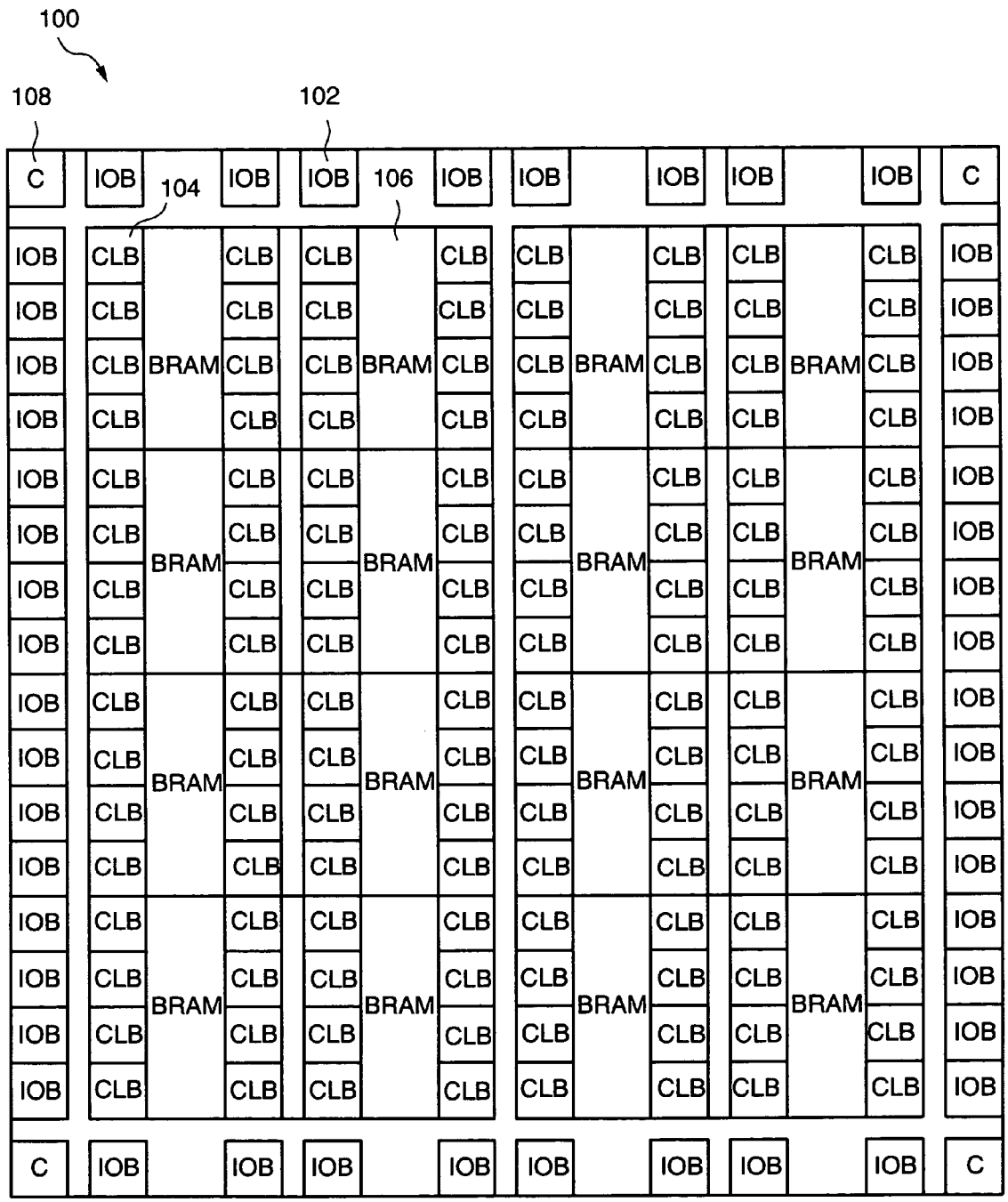
FIG. 1 is a block diagram illustrating the general layout of an FPGA within which embodiments of the present invention may be implemented.

FIG. 1 illustrates the general layout of IOBs, CLBs, and block RAMs (BRAMs) of an example field programmable gate array (FPGA) 100 within which some embodiments of the present invention may be implemented. IOBs 102 are well-known, and are located around the perimeter of FPGA 100. CLBs 104 are well-known, and are arranged in columns in FPGA 100. Block RAMs 106 are well-known, and are arranged in columns between adjacent CLB columns. A well-known programmable interconnect circuitry (not shown for simplicity) is provided to programmably connect the IOBs 102, CLBs 104, and block RAMs 106. Corner blocks 108 are well-known, and may contain configuration circuitry and/or may be used to provide additional routing resources. Although a particular FPGA layout is illustrated in FIG. 1, it is to be understood that many other FPGA layouts are possible, and are considered to fall within the scope of the present invention. Thus, for other embodiments, FPGA 100 can have other numbers of IOBs 102, CLBs 104, and block RAMs 106, and can have other types of blocks, such as multipliers and/or processors, and other arrangements and architectures.

The IOBs 102, CLBs 104, and the programmable interconnect structure are typically programmed by loading configuration data into configuration memory cells which control the states of various configurable elements (e.g., switches, multiplexers, and the like) that configure the IOBs, CLBs, and the interconnect structure to implement a desired function. The configuration data, which is usually stored in an external non-volatile memory such as a Programmable Read Only Memory (PROM), an Electrically Erasable PROM (EEPROM), or a Flash memory, is provided via one or more configuration input pins to a well-known configuration circuit within the FPGA (the external memory, configuration pins, and configuration circuit are not shown in FIG. 1 for simplicity). For some embodiments, FPGA 100 also includes well-known test circuitry such as that defined in IEEE standard 1149.1 and commonly known as the JTAG standard (not shown for simplicity) that may be used in a well-known manner to configure FPGA 100 to implement one or more user-specified designs.

Figure 2:
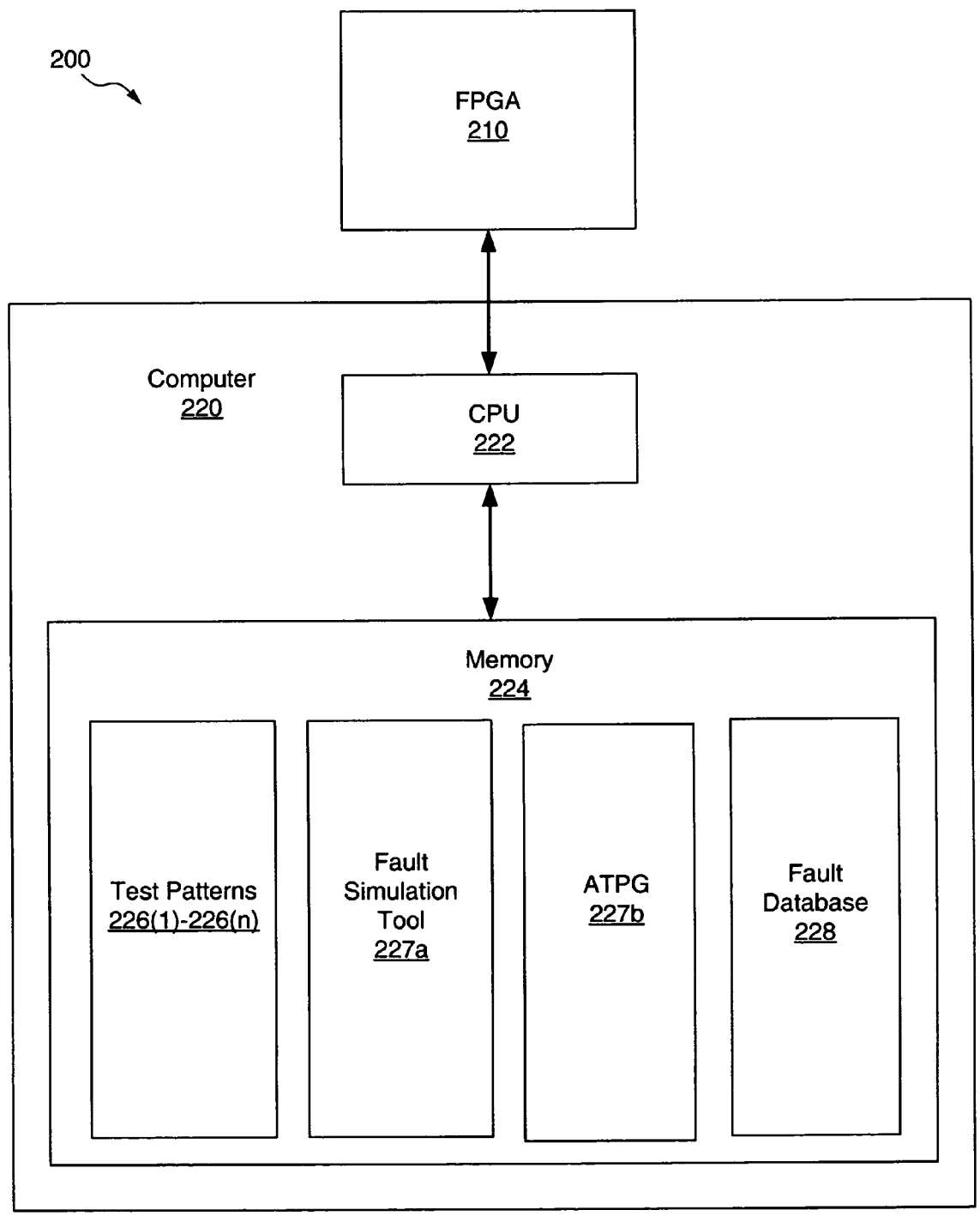
FIG. 2 depicts a block diagram of an exemplary embodiment of a test system that may be used for detecting faults in the FPGA of FIG. 1.

FIG. 2 depicts a block diagram of an exemplary embodiment of a system 200 that may be used for fault testing and diagnosis of IC devices such as FPGA 100 in accordance with one or more aspects of the present invention. System 200 includes an FPGA under test 210 and a computer 220. For some embodiments, FPGA 210 is consistent with the FPGA architecture 100 shown in FIG. 1, although other FPGA architectures and other programmable devices may be tested using present embodiments. Computer 220 is suitable for executing programs and instructions according to the present invention. Computer 220 is shown to include a central-processing unit (CPU) 222 and a memory 224. For simplicity, other well-known elements of computer 220 such as input/output circuits, user interfaces, and the like, are not shown in FIG. 2. CPU 222, which may be any well-known processor, has access to FPGA under test 210 and memory 224, and may include various well-known CPU components such as read/write registers, execution units, fetch and decode logic, cache memory, memory controllers, bus controllers, I/O interfaces, and the like. Memory 224, which may be any well-known memory device such as RAM, EEPROM, EPROM, flash memory, a hard-disk, or an optical storage device, stores various test patterns 226(1)–226(n) for FPGA 210, a fault simulation tool 227a, an ATPG 227b, and a fault database 228. For other embodiments, other arrangements are possible. For example, one or more of test patterns 226, fault simulation tool 227a, ATPG 227b, and/or fault database 228 may be stored in memory external to computer 220.

Each of test patterns 226(1)–226(n) is a circuit design suitable for testing various logic blocks and interconnections within FPGA 210 for defects. As used herein, the term logic block refers to any circuit, block, logic, or interconnection device within FPGA 210, for example, such as a CLB, 10B, corner block, memory, and the like. The construction of test patterns 226, as well as their application to an IC device such as FPGA 210 to generate pre-computed fault signatures, expected circuit responses, observed circuit responses, and fault coverage information, is well-known and therefore not described in detail herein.

Fault simulation tool 227a is a software program used by computer 220 to implement various testing and/or diagnostic operations in accordance with the present invention. More specifically, fault simulation tool 227a may be used to simulate the effect of a fault within FPGA 210, for example, to determine whether the fault is detectable by a particular FPGA test pattern. Although described herein as a software component, simulation tool 227a may, for other embodiments, be implemented entirely in hardware or alternately as a combination of software and hardware. Further, for alternate embodiments, fault simulation tool 227a may be implemented externally of computer 220.

ATPG 227b may be any well-known tool that generates test vectors to be applied to FPGA 210 to determine whether FPGA 210 contains any faults.

Fault database 228 stores fault coverage information for each of test patterns 226(1)–226(n). Such fault coverage information may be generated using various well-known fault grading techniques, and is therefore not described in detail herein. For some embodiments, fault database 228 also stores fault simulation information such as, for example, a potential fault set for FPGA 210 as well as a set of test vectors, fault signatures, expected circuit responses, and observed circuit responses for each test pattern. For other embodiments, the fault simulation information may be stored in another portion of memory 224, or alternatively in a suitable external memory device (not shown for simplicity) accessible by computer 220.

Figure 3:
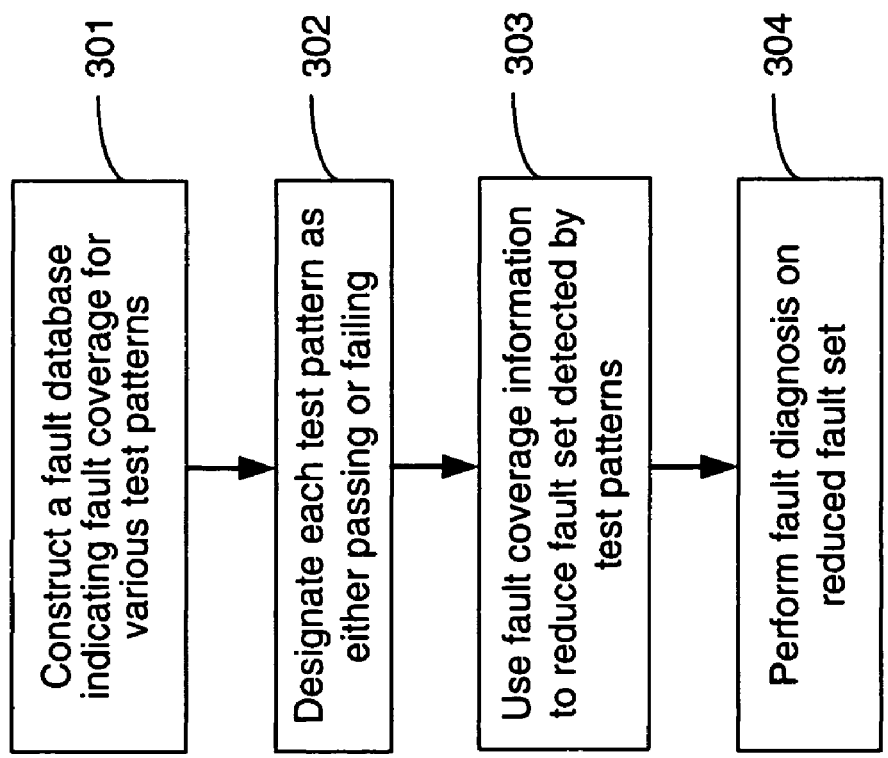
FIG. 3 is a flow chart illustrating an exemplary operation for detecting faults in accordance with one embodiment of the present invention.
Figure 4A:
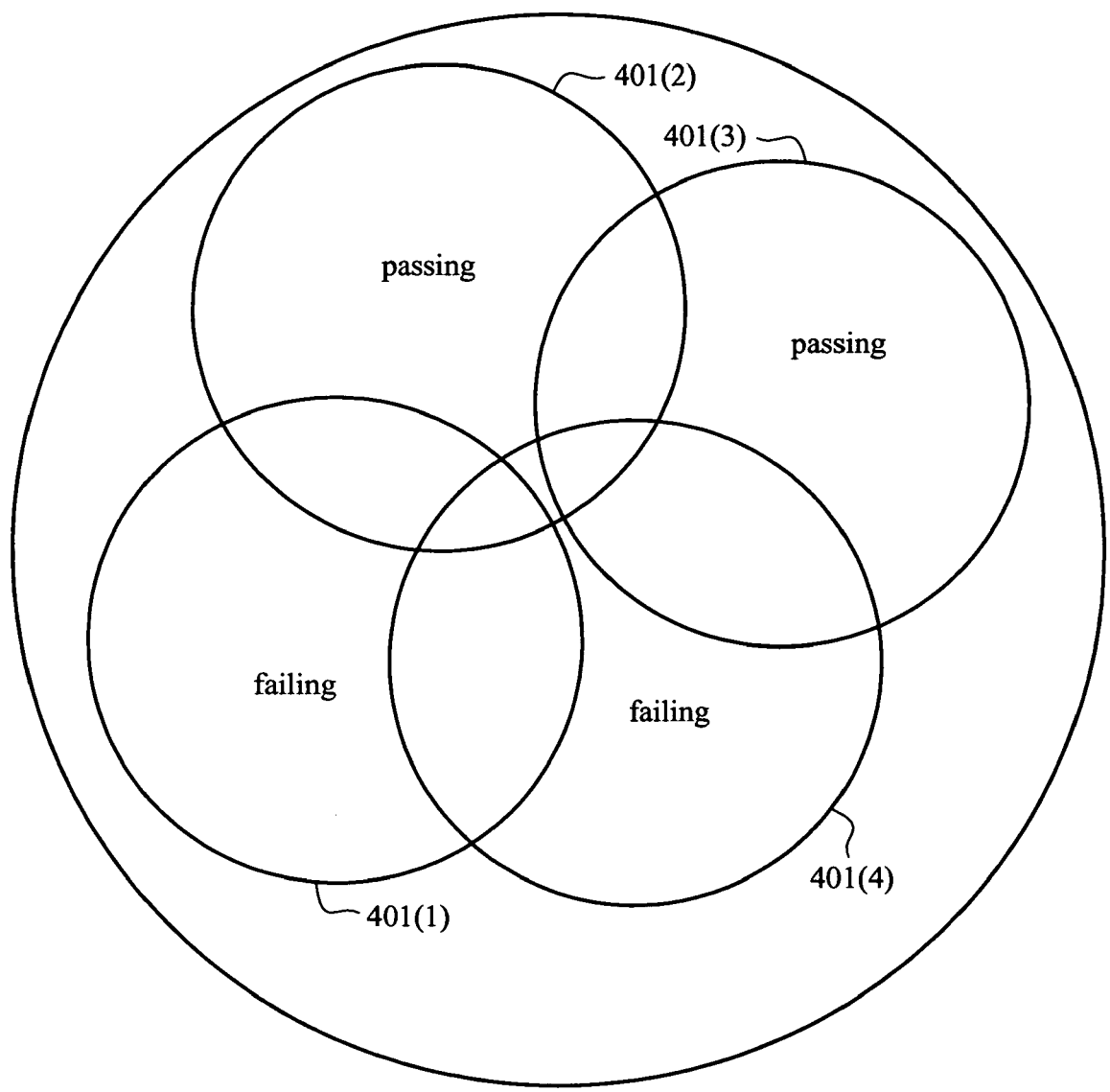
FIG. 4A is a Venn diagram depicting exemplary fault coverages for a number of test patterns for one embodiment of the testing operation illustrated in FIG. 3.
Figure 4B:
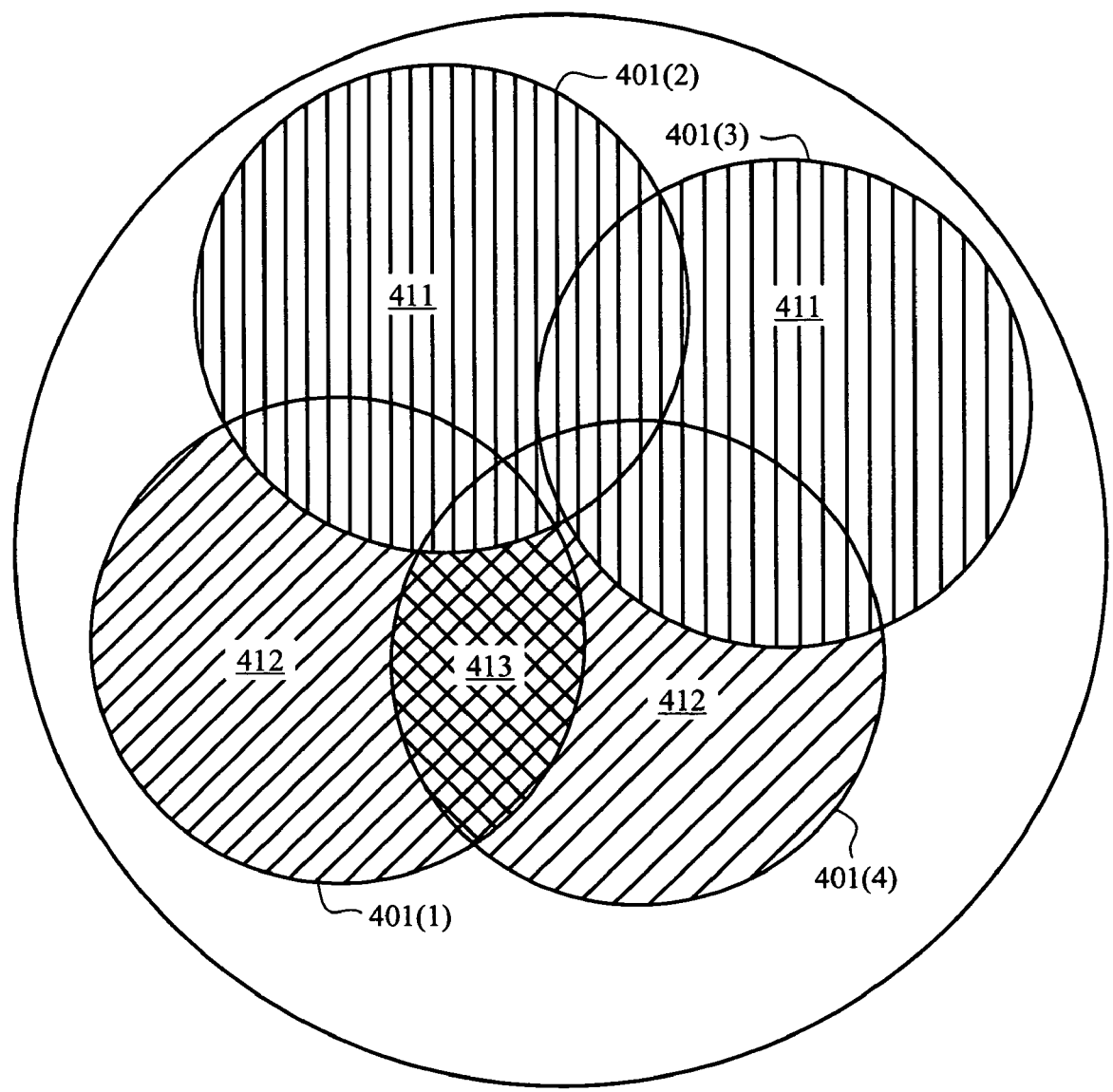
FIG. 4B is a Venn diagram depicting overlapping fault coverages for passing and failing test patterns of FIG. 4B.
Figure 4C:
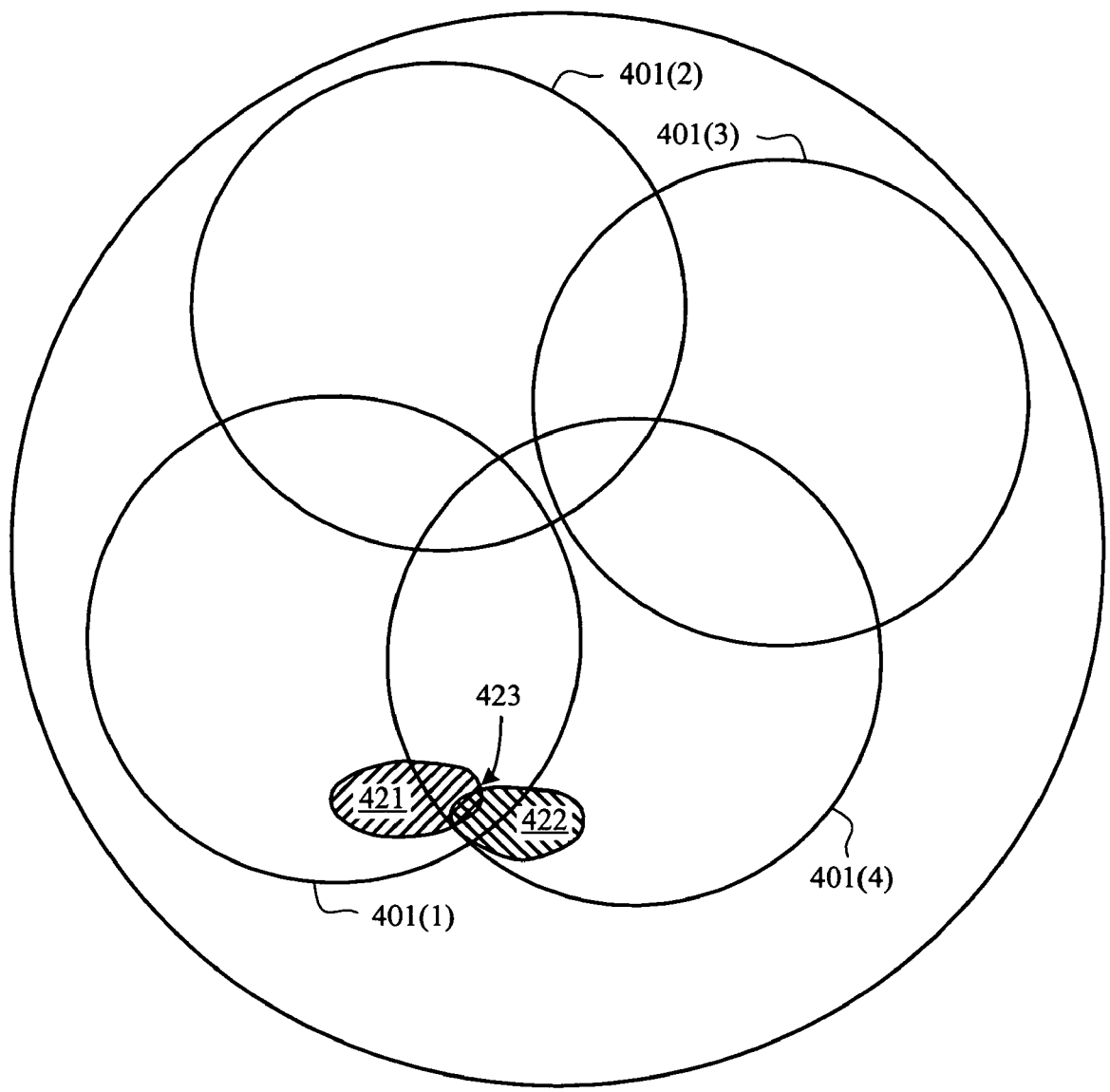
FIG. 4C is a Venn diagram depicting the generation of a reduced fault set for an exemplary embodiment of FIG. 3.

An exemplary fault testing and diagnosis operation for system 200 using four test patterns 226(1)–226(4) is described below with respect to the flow chart of FIG. 3 and the venn diagrams of FIGS. 4A–4C. For actual embodiments, any number of test patterns 226 may be used to test FPGA 210 for defects. First, the fault database 228 for FPGA 210 is constructed to include fault coverage information for each test pattern 226(1)–226(4) (301). For example, FIG. 4A is a Venn diagram illustrating the fault coverage for the exemplary group of test patterns 226(1)–226(4), where circle 401(1) represents the fault coverage for a first test pattern 226(1), circle 401(2) represents the fault coverage for a second test pattern 226(2), circle 401(3) represents the fault coverage for a third test pattern 226(3), and circle 401(4) represents the fault coverage for a fourth test pattern 226(4). For some embodiments, the test patterns 226 are selected such that (i) all possible faults are detected by at least one test pattern and (ii) each test pattern detects at least one unique fault. Note that the fault coverage circles 401(1)–401(4) depicted in FIG. 4A overlap one another to indicate that multiple test patterns may utilize and test the same resources within FPGA 210.

As mentioned above, the fault coverage information for each test pattern 226 may be generated using various well-known fault simulation techniques. For some embodiments in which FPGA 210 is an existing FPGA architecture that has been previously fault graded using test patterns 226(1)–226(4), the fault coverage information embodied in fault database 228 may already exist. Thus, for such embodiments, the fault coverage information may be collected from previous simulations and written to fault database 228, thereby eliminating the time-consuming process of separately generating fault coverage information for FPGA 210.

In contrast to conventional fault dictionary-type approaches that preclude fault dropping during fault grading operations, the fault coverage information embodied in fault database 228 may be generated using well-known fault dropping techniques, which in turn may significantly reduce the size of fault database 228, for example, as compared to a conventionally formed fault dictionary. Further, while conventional fault dictionary-type approaches typically require fault coverage information for all test vectors that may be applied to the DUT, present embodiments require only fault coverage information for each test pattern (e.g., which faults are detectable by which test patterns) and not all of the test vectors that may be applied for a given test pattern, which further reduces the size of fault database 228 over conventionally created fault dictionaries. The reduced size of fault database 228 not only saves storage space but also significantly reduces the computational requirements for fault simulation and diagnosis operations for present embodiments, thereby allowing present embodiments to incorporate a fault dictionary-type approach for fault testing PLDs such as FPGA 210.

After construction of fault database 228, the FPGA is tested for faults using each test pattern 226 in a conventional manner, and then each test pattern is designated as either passing or failing (302). For one example, the FPGA 210 is first configured and tested with each of the test patterns 226(1)–226(4) using any well-known fault testing technique. For each test pattern, if the application of a set of test vectors to FPGA 210 does not reveal any faults, the test pattern is designated as a passing test pattern. Conversely, if the application of the set of test vectors to FPGA 210 reveals any faults, the test pattern is designated as a failing test pattern. For the exemplary testing operation of FPGA 210 depicted in FIGS. 4A–4C, test patterns 226(1) and 226(4) are designated as failing test patterns, and test patterns 226(2) and 226(3) are designated as passing test patterns.

Then, in accordance with some embodiments of the present invention, the fault coverage information embodied by fault database 228 is used to reduce the possible fault set detectable by test patterns 226 (303). For one embodiment, any faults that are detectable by one or more passing test patterns 226 are eliminated from the fault set, and any faults that are not detected by two or more failing test patterns 226 are eliminated from the fault set. For the exemplary testing operation depicted in FIG. 4B, all faults detectable by passing test patterns 401(2) and 401(3), which are represented in FIG. 4B by area 411, are eliminated from the fault set, and all faults that are not detectable by both failing test patterns 226(1) and 226(4), which are represented in FIG. 4B by area 412, are eliminated from the fault set. The remaining faults, which are depicted in FIG. 4B as area 413, form a reduced fault set in accordance with the present invention.

Thereafter, the faults remaining in the reduced fault set (e.g., as depicted by area 413 of FIG. 4B) may be further reduced and localized using any suitable fault diagnosis technique (304). For some embodiments, the diagnosis technique described in U.S. patent application Ser. No. 10/280,611 entitled "Method and Apparatus for Localizing Faults Within a Programmable Logic Device" by Mark et al. and filed on Oct. 25, 2002 now U.S. Pat. No. 6,889,368, which is incorporated herein by reference in its entirety, may be used to localize the remaining faults. For example, referring to FIG. 4C, a suitable fault diagnosis technique may be used to reduce the remaining faults detected by failing test patterns 401(1) and 401(4) to coverage areas 421 and 422, respectively. Then, the fault set may be further reduced to those faults that are common to areas 421 and 422, e.g., to the faults within coverage area 423. In this manner, the number of potential fault sites to be localized by fault diagnosis may be significantly reduced without the need for further testing or employing impractically large fault dictionaries.

As described above, embodiments of the present invention may significantly reduce the time and resources required for identifying faults in IC devices such as FPGAs by utilizing fault coverage information for various test patterns to generate a reduced fault set that may be more easily diagnosed to localize the remaining faults than prior techniques that attempt to diagnose all potential faults in the device without utilizing fault coverage information. Further, as mentioned above, because embodiments of the present invention utilize only the fault coverage for each test pattern to generate a reduced fault set, as opposed to requiring more detailed information such as the fault coverage of each test vector and/or knowledge of which clock cycles activate which faults, the fault coverage information utilized by present embodiments may be generated more quickly than conventional fault dictionaries.

Figure 5:
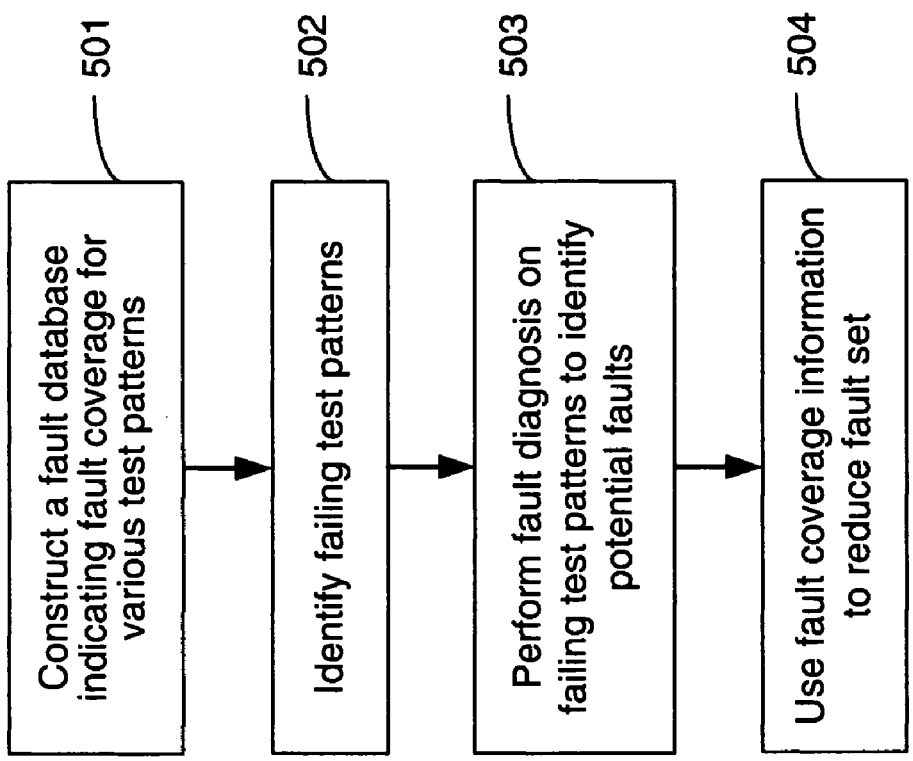
FIG. 5 is a flow chart illustrating an exemplary operation for detecting faults in accordance with another embodiment of the present invention.
Figure 6A:
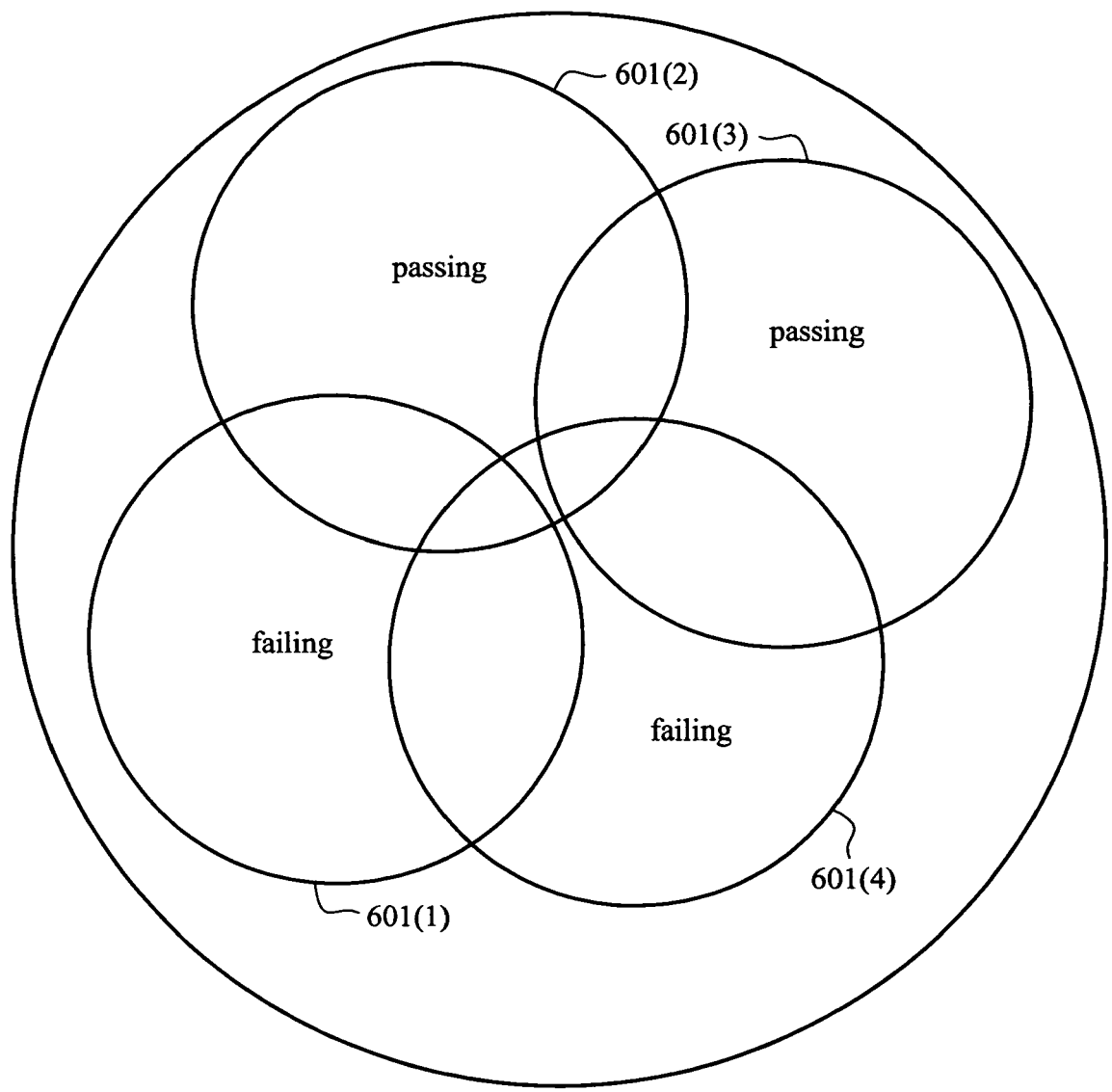
FIG. 6A is a Venn diagram depicting exemplary fault coverages for a number of test patterns for one embodiment of the testing operation illustrated in FIG. 5.

For other embodiments, fault diagnosis techniques may be employed prior to reducing the fault set using the fault coverage information stored in fault database 228. For example, another exemplary test operation for FPGA 210 using test patterns 226(1)–226(4) is described below with respect to the illustrative flow chart of FIG. 5. First, fault database 228 is constructed to include fault coverage information for test patterns 226 using a well-known fault simulation technique (501). Referring also to FIG. 6A, circles 601(1)–601(4) represent exemplary fault coverages for test patterns 226(1)–226(4), respectively, which as mentioned above may already exist from prior simulations of FPGA 210. Next, the failing test patterns are identified using any suitable fault testing technique (502). For purposes of discussion herein, test patterns 226(2)–226(3) are passing patterns, and test patterns 226(1) and 226(4) are failing patterns. Thus, circles 601(2)–601(3) represent the fault coverage of the passing test patterns, and circles 601(1) and 601(4) represent the fault coverage of the failing test patterns.

Figure 6B:
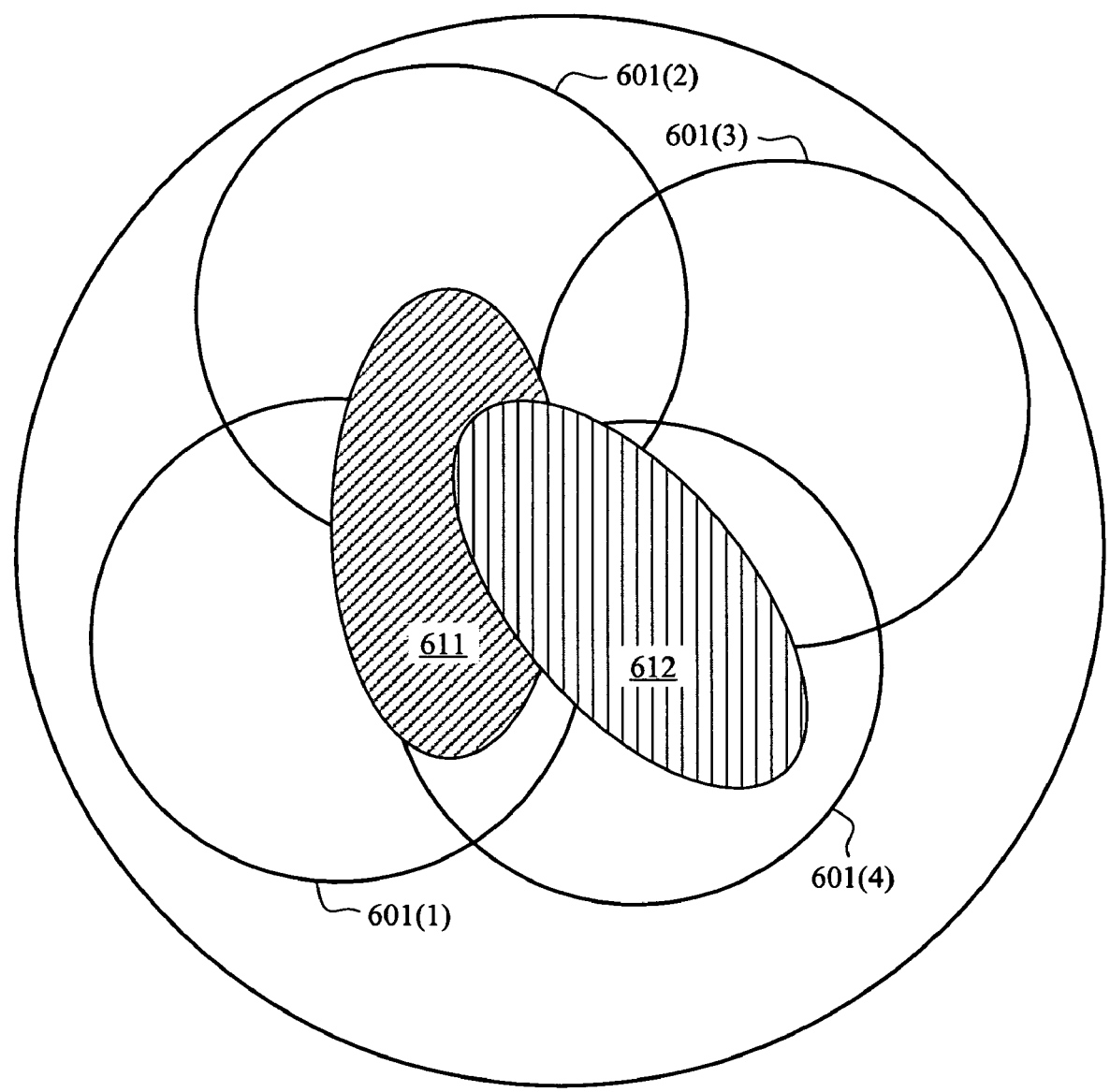
FIG. 6B is a Venn diagram depicting potential fault sets identified by fault diagnosing the failing test patterns of FIG. 6A.
Figure 6C:
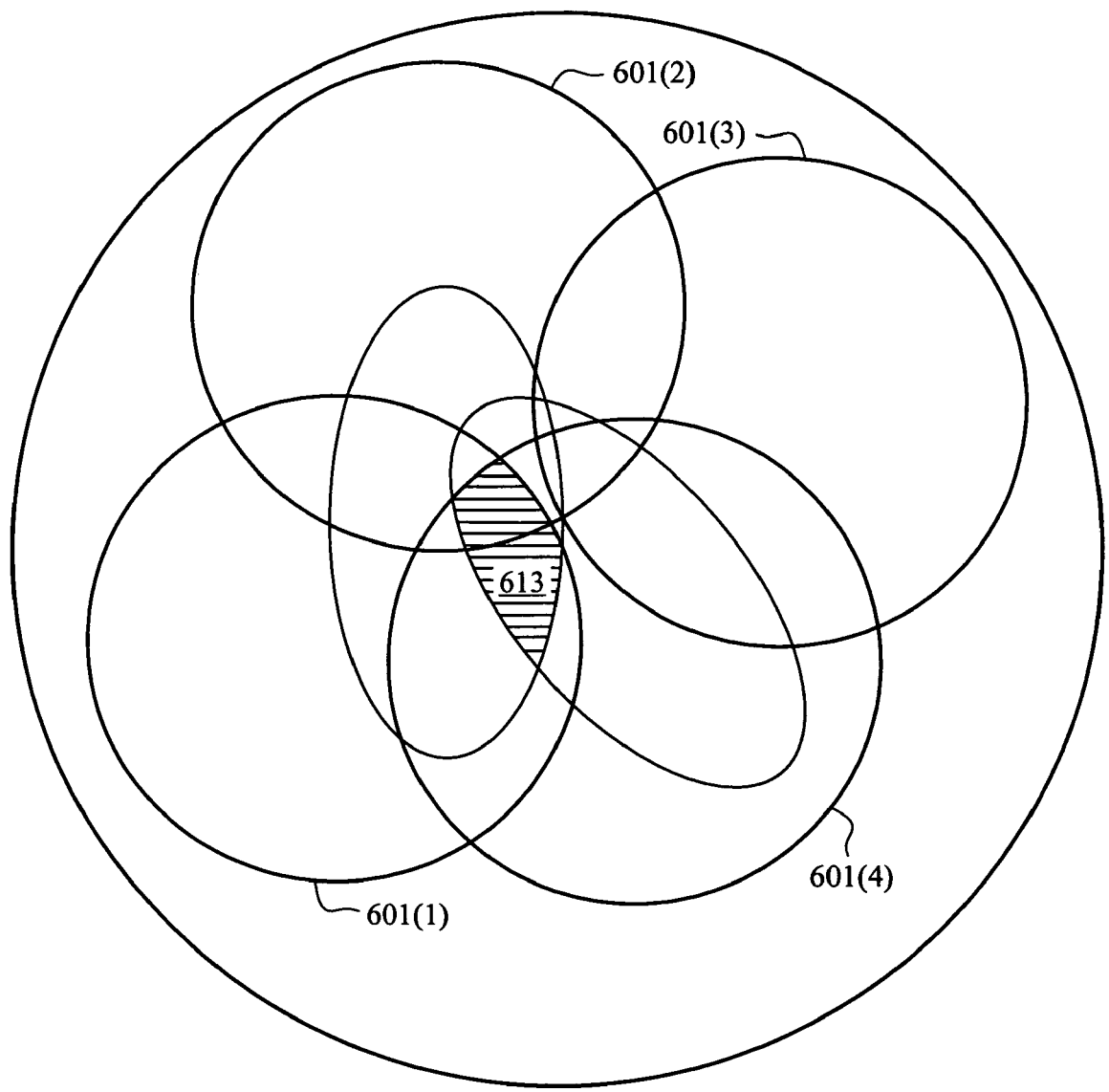
FIG. 6C is a Venn diagram depicting the generation of a reduced fault set using the fault coverage information of FIG. 6A for an exemplary embodiment.

Then, a suitable fault diagnosis technique (e.g., such as that described in U.S. patent application Ser. No. 10/280,611 now U.S. Pat. No. 6,889,368 referenced above) is employed to identify all possible faults in each of the failing test patterns (503). For example, referring also to FIG. 6B, area 611 depicts the fault set identified by diagnosing failing test pattern 226(1), and area 612 depicts the fault set identified by diagnosing failing test pattern 226(4). Because the faults identified by diagnosing failing test patterns 226(1) and 226(4) may utilize some FPGA resources whose potential faults may not be detected by failing test patterns 226(1) or 226(4), the exemplary fault sets depicted by areas 611 and 612 of FIG. 6B do not lie not entirely within the fault coverage areas of 401(1) and 401(4), respectively. Next, the fault coverage information stored in fault database 228 is used to reduce the fault set identified by the fault diagnosis technique (504). More specifically, any faults that are not common to fault sets 611–612 and that are not within fault coverage areas 601(1) and 601(4) of the failing test patterns 226(1) and 226(4), respectively, are eliminated to generate a reduced fault set, for example, as depicted by area 613 of FIG. 6C. In this manner, embodiments of the present invention utilize the fault coverage information for test patterns 226(1)–226(4) to generate a reduced fault set, which in turn may significantly simplify the complexity of and greatly reduce time required to perform fault diagnosis.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of detecting faults in a programmable device, comprising:

determining a fault coverage for each of a plurality of test patterns for the programmable device;

wherein each fault coverage indicates one or more faults that are detectable by a corresponding test pattern;

identifying a potential fault set for the programmable device;

configuring the programmable device with the test patterns;

applying a set of test vectors to the programmable device configured with the test patterns;

identifying a test pattern as a failing test pattern in response to indication of one or more faults by the test pattern responding to application of the test vectors;

identifying a test pattern as a pattern test pattern in response to no indication of faults by the test pattern responding to application of the test vectors; and reducing the potential fault set using the fault coverages;

wherein the reducing includes eliminating from the potential fault set, faults that are not detectable by at least two failing test patterns as indicated by the fault coverages of the at least two failing test patterns.

2. The method of claim 1, wherein each test pattern detects at least one unique fault.

3. The method of claim 1, wherein the determining comprises collecting preexisting fault coverages.

4. The method of claim 1, wherein each fault coverage indicates only which faults are detected by a corresponding test pattern.

5. The method of claim 1, further comprising:

storing the fault coverages in a database.

6. The method of claim 1, wherein the determining comprises:

generating the plurality of test patterns; and fault simulating the test patterns to generate the fault coverages.

7. The method of claim 1, wherein the identifying comprises:

for each failing test pattern, diagnosing the test pattern for faults to generate a corresponding fault set.

8. The method of claim 7, wherein the reducing comprises:

eliminating faults from the potential fault set that are not common to the fault sets.

9. The method of claim 1, wherein the reducing comprises:

eliminating faults from the potential fault set that are detectable by one or more passing test patterns.

10. The method of claim 9, wherein the potential fault set comprises a combination of the fault coverages.

11. The method of claim 9, further comprising:

diagnosing faults not eliminated from the potential fault set.

12. A method of diagnosing faults in a programmable device, comprising:

constructing a database containing fault coverage information for each of a plurality of test patterns for the programmable device;

wherein the fault coverage information indicates one or more faults that are detectable by each test pattern;

determining whether each test pattern is a failing test pattern or a passing test pattern;

eliminating all faults from a potential fault set that are not detectable by at least two failing test patterns as indicated by the fault coverage information of the at least two failing test patterns;

eliminating all faults from the potential fault set that are detectable by one or more passing test patterns as indicated by the fault coverage information of the one or more passing test patterns; and diagnosing any remaining faults in the potential fault set.

13. The method of claim 12, wherein the determining comprises, for each test pattern:

configuring the programmable device with the test pattern;

applying a set of test vectors to the programmable device;

designating the test pattern as a failing test pattern if the test pattern detects one or more faults; and designating the test pattern as a passing test pattern if the test pattern does not detect any faults.

14. A method of diagnosing faults in a programmable device, comprising:

constructing a database containing fault coverage information for each of a plurality of test patterns for the programmable device;

wherein the fault coverage information indicates one or more faults that are detectable by each test pattern;

determining whether each test pattern is a failing test pattern;

diagnosing each failing test pattern for faults to generate a corresponding fault set;

eliminating from a potential fault set that includes all faults that are detectable by each failing test pattern, faults that are not common to the fault sets; and eliminating from the potential fault set, faults that are not detectable by at least one failing test pattern.

15. The method of claim 14, wherein the determining comprises, for each test pattern:

configuring the programmable device with the test pattern;

applying a set of test vectors to the programmable device; and designating the test pattern as a failing test pattern if the test pattern detects one or more faults.

16. A circuit for detecting faults in a programmable device, comprising:

means for determining a fault coverage for each of a plurality of test patterns for the programmable device;

wherein each fault coverage indicates one or more faults that are detectable by a corresponding test pattern;

means for identifying a potential fault set for the programmable device;

means for configuring the programmable device with the test patterns;

means for applying a set of test vectors to the programmable device configured with the test patterns;

means for identifying a test pattern as a failing test pattern in response to indication of one or more faults by the test pattern responding to application of the test vectors;

means for identifying a test pattern as a passing test pattern in response to no indication of faults by the test pattern responding to application of the test vectors; and means for reducing the potential fault set using the fault coverages;

wherein the means for reducing includes means for eliminating from the potential fault set, faults that are not detectable by at least two failing test patterns as indicated by the fault coverages of the at least two failing test patterns.

17. The circuit of claim 16, wherein each test pattern detects at least one unique fault.

18. The circuit of claim 16, wherein the means for determining comprises means for collecting preexisting fault coverages.

19. The circuit of claim 16, wherein each fault coverage indicates only which faults are detected by a corresponding test pattern.

20. The circuit of claim 16, further comprising:

means for storing the fault coverages in a database.

21. The circuit of claim 16, wherein the means for determining comprises:

means for generating the plurality of test patterns; and means for fault simulating the test patterns to generate the fault coverages.

22. The circuit of claim 16, wherein the identifying comprises:

means for diagnosing each failing test pattern for faults to generate a corresponding fault set.

23. The circuit of claim 22, wherein the reducing comprises:

means for eliminating faults from the potential fault set that are not common to the fault sets.

24. The circuit of claim 16, wherein the means for reducing comprises:

means for eliminating faults that are detectable by one or more passing test patterns.

25. The circuit of claim 24, wherein the potential fault set comprises a combination of the fault coverages.

26. The circuit of claim 24, further comprising:

means for diagnosing the faults not eliminated from the potential fault set.

27. A circuit for diagnosing faults in a programmable device, comprising:

means for constructing a database containing fault coverage information for each of a plurality of test patterns for the programmable device;
wherein the fault coverage information indicates one or more faults that are detectable by each test pattern;
means for determining whether each test pattern is a failing test pattern or a passing test pattern;
means for eliminating all faults from a potential fault set that are not detectable by at least two failing test patterns as indicated by the fault coverage information of the at least two failing test patterns;
means for eliminating all faults from the potential fault set that are detectable by one or more passing test patterns as indicated by the fault coverage information of the one or more passing test patterns; and
means for diagnosing any remaining faults in the potential fault set.

28. The circuit of claim 27, wherein the determining comprises, for each test pattern:
means for configuring the programmable device with the test pattern;
means for applying a set of test vectors to the programmable device;
means for designating the test pattern as a failing test pattern if the test pattern detects one or more faults; and
means for designating the test pattern as a passing test pattern if the test pattern does not detect any faults.

29. A circuit for detecting faults in a programmable device, comprising:
means for constructing a database containing fault coverage information for each of a plurality of test patterns for the programmable device;
wherein the fault coverage information indicates one or more faults that are detectable by each test pattern;
means for determining whether each test pattern is a failing test pattern;
means for diagnosing each failing test pattern for faults to generate a corresponding fault set;
means for eliminating from a potential fault set that includes all faults that are detectable by each failing test pattern, faults that are not common to the fault sets; and
means for eliminating from the potential fault set, faults that are not detectable by at least one failing test pattern.

30. The circuit of claim 29, wherein the determining comprises, for each test pattern:
means for configuring the programmable device with the test pattern;
means for applying a set of test vectors to the programmable device; and
means for designating the test pattern as a failing test pattern if the test pattern detects one or more faults.

* * * * *